United States Patent
Jang et al.

(10) Patent No.: US 10,036,961 B2
(45) Date of Patent: Jul. 31, 2018

(54) OPTICAL PROXIMITY CORRECTION (OPC) METHOD AND METHOD OF FABRICATING MASK USING THE OPC METHOD

(71) Applicant: SAMSUNG ELECTRONICS CO., LTD., Suwon-si, Gyeonggi-do (KR)

(72) Inventors: Sung-hoon Jang, Hwaseong-si (KR); Sang-hwa Lee, Seoul (KR)

(73) Assignee: Samsung Electronics Co., Ltd., Suwon-Si, Gyeonggi-do (KR)

( * ) Notice: Subject to any disclaimer, the term of this patent is extended or adjusted under 35 U.S.C. 154(b) by 62 days.

(21) Appl. No.: 15/240,105

(22) Filed: Aug. 18, 2016

(65) Prior Publication Data

US 2017/0123327 A1 May 4, 2017

(30) Foreign Application Priority Data

Nov. 2, 2015 (KR) ................. 10-2015-0153259

(51) Int. Cl.
| | | |
|---|---|---|
| *G03F 7/20* | (2006.01) | |
| *G03F 1/72* | (2012.01) | |
| *G03F 1/76* | (2012.01) | |
| *G03F 1/78* | (2012.01) | |

(52) U.S. Cl.
CPC ............ *G03F 7/70441* (2013.01); *G03F 1/72* (2013.01); *G03F 1/76* (2013.01); *G03F 1/78* (2013.01)

(58) Field of Classification Search
CPC ..... G03F 1/72; G03F 1/76; G03F 1/78; G03F 7/70441

USPC ........................................................ 430/5, 30
See application file for complete search history.

(56) References Cited

U.S. PATENT DOCUMENTS

| | | | |
|---|---|---|---|
| 6,898,781 B2 | 5/2005 | Singh et al. | |
| 7,588,867 B2 | 9/2009 | Kamm et al. | |
| 8,039,177 B2 * | 10/2011 | Uno | G03F 1/70 382/144 |
| 8,683,394 B2 | 3/2014 | Simmons | |
| 8,839,157 B2 | 9/2014 | Tsai et al. | |
| 8,975,195 B2 | 3/2015 | Lukanc et al. | |
| 2012/0224156 A1 | 9/2012 | Lee et al. | |
| 2012/0284675 A1 | 11/2012 | Shiely et al. | |
| 2014/0013287 A1 | 1/2014 | Cheng et al. | |
| 2015/0058815 A1 | 2/2015 | Liu et al. | |
| 2016/0077426 A1 | 3/2016 | Jang et al. | |

FOREIGN PATENT DOCUMENTS

| | | |
|---|---|---|
| KR | 10-2009-0037188 A | 4/2009 |
| KR | 10-2010-0073093 A | 7/2010 |
| KR | 10-2012-0100297 A | 9/2012 |

* cited by examiner

*Primary Examiner* — Christopher G Young
(74) *Attorney, Agent, or Firm* — Lee & Morse, P.C.

(57) ABSTRACT

An optical proximity correction method includes loading a target layout for a mask, generating a correction density map based on manipulation of flare to correct global errors caused by exposing equipment, generating a flare map via convolution integration of the correction density map and a point spread function (PSF) regarding the flare, and correcting the target layout using the flare map and an OPC model.

20 Claims, 16 Drawing Sheets

FIG. 3

|    | 1 | 2 | 3 | 4 | 5 | 6 | 7 | 8 | 9 | 10 | 11 | 12 | |
|----|------|------|------|-------|------|------|------|------|------|------|------|------|------|
| 1  | 33.2 | 32.4 | 32.6 | 33.3  | 33.8 | 33.8 | 33.8 | 34.2 | 34.2 | 34.5 | 34.4 | 34.9 | 33.8 |
| 2  | 32.4 | 32.3 | 32.8 | 32.5  | 33.0 | 33.3 | 33.8 | 34.0 | 34.1 | 34.3 | 34.2 | 34.6 | 33.5 |
| 3  | 32.3 | 32.5 | 32.7 | 33.0  | 33.3 | 33.6 | 34.4 | 33.9 | 34.5 | 34.7 | 34.8 | 34.7 | 33.7 |
| 4  | 33.0 | 33.0 | 33.3 | 322.8 | 33.5 | 33.1 | 34.5 | 34.5 | 34.0 | 35.3 | 35.0 | 34.9 | 33.9 |
| 5  | 32.5 | 32.8 | 32.9 | 33.0  | 33.3 | 33.5 | 34.0 | 34.1 | 34.4 | 34.8 | 34.8 | 34.7 | 33.7 |
| 6  | 32.6 | 32.9 | 32.8 | 33.1  | 33.5 | 34.2 | 34.1 | 34.2 | 34.4 | 37.7 | 34.8 | 35.0 | 33.8 |
| 7  | 32.9 | 33.3 | 33.2 | 33.5  | 34.0 | 34.5 | 34.4 | 34.8 | 34.6 | 35.0 | 35.0 | 35.4 | 34.2 |
| 8  | 32.9 | 32.5 | 33.0 | 33.2  | 33.7 | 34.0 | 34.0 | 34.4 | 34.3 | 35.2 | 34.9 | 35.0 | 33.9 |
| 9  | 32.7 | 32.9 | 33.1 | 33.3  | 33.7 | 34.2 | 34.3 | 34.3 | 34.7 | 34.9 | 34.5 | 35.0 | 34.0 |
| 10 | 33.1 | 32.9 | 33.5 | 33.9  | 34.0 | 34.2 | 34.8 | 34.6 | 34.8 | 35.2 | 35.3 | 35.4 | 34.3 |
| 11 | 32.8 | 32.9 | 32.9 | 33.3  | 33.5 | 34.2 | 34.1 | 34.5 | 34.4 | 34.7 | 35.2 | 35.1 | 34.0 |
| 12 | 33.0 | 33.1 | 33.1 | 33.2  | 33.5 | 33.6 | 34.2 | 34.1 | 34.4 | 34.8 | 35.1 | 35.4 | 34.0 |
| 13 | 33.3 | 33.3 | 33.7 | 33.6  | 34.1 | 34.1 | 34.3 | 34.6 | 34.8 | 35.0 | 35.1 | 35.4 | 34.3 |
| 14 | 32.8 | 33.1 | 33.5 | 32.9  | 33.8 | 33.5 | 34.1 | 34.2 | 34.6 | 34.7 | 35.1 | 35.0 | 33.9 |
| 15 | 32.7 | 32.8 | 33.3 | 33.4  | 33.8 | 33.9 | 34.4 | 34.1 | 34.5 | 34.8 | 35.5 | 35.6 | 34.1 |
| 16 | 33.0 | 33.3 | 33.4 | 33.5  | 33.7 | 33.2 | 33.9 | 33.9 | 34.5 | 34.5 | 34.7 | 35.0 | 33.9 |
| 17 | 33.1 | 33.1 | 33.2 | 33.4  | 33.8 | 33.9 | 34.0 | 34.4 | 34.2 | 34.8 | 35.3 | 35.2 | 34.0 |
| 18 | 33.0 | 33.0 | 33.4 | 33.4  | 33.8 | 34.2 | 34.5 | 34.5 | 34.9 | 35.3 | 35.3 | 35.5 | 34.2 |
| 19 | 33.2 | 33.1 | 33.1 | 33.4  | 33.8 | 33.8 | 33.9 | 34.2 | 34.4 | 34.5 | 35.3 | 35.2 | 34.0 |
| 20 | 32.9 | 33.2 | 33.2 | 33.0  | 33.5 | 33.9 | 33.8 | 34.6 | 34.8 | 34.7 | 35.2 | 35.1 | 34.0 |
| 21 | 33.3 | 33.5 | 33.3 | 33.6  | 34.0 | 34.2 | 33.5 | 34.7 | 34.7 | 35.2 | 35.5 | 35.7 | 34.3 |
| 22 | 32.9 | 33.2 | 33.1 | 33.4  | 33.8 | 33.9 | 34.2 | 34.5 | 34.5 | 34.8 | 34.7 | 35.2 | 34.0 |
| 23 | 32.5 | 32.9 | 33.1 | 33.6  | 33.7 | 34.5 | 33.6 | 34.4 | 34.4 | 34.9 | 35.0 | 35.1 | 34.0 |
| 24 | 33.5 | 33.0 | 33.2 | 33.4  | 34.0 | 34.5 | 33.4 | 35.0 | 34.8 | 34.9 | 36.6 | 35.6 | 34.2 |
| 25 | 33.0 | 33.0 | 33.1 | 33.3  | 33.8 | 33.9 | 33.9 | 34.3 | 34.5 | 35.0 | 34.7 | 34.9 | 33.9 |
| 26 | 33.2 | 33.3 | 33.1 | 33.1  | 33.5 | 34.4 | 34.0 | 34.5 | 34.4 | 35.0 | 34.4 | 34.7 | 34.0 |
| 27 | 33.5 | 33.7 | 33.9 | 33.5  | 34.0 | 34.5 | 34.7 | 35.1 | 34.9 | 35.4 | 35.5 | 35.5 | 34.5 |
| 28 | 33.3 | 33.4 | 33.6 | 33.5  | 33.7 | 33.9 | 34.3 | 34.5 | 34.8 | 35.0 | 34.8 | 35.4 | 34.2 |
| 29 | 33.3 | 33.5 | 34.0 | 33.7  | 33.5 | 33.9 | 34.3 | 34.5 | 34.7 | 35.2 | 35.1 | 35.7 | 34.3 |
| 30 | 32.5 | 33.0 | 32.8 | 32.8  | 33.9 | 34.1 | 34.2 | 34.7 | 34.3 | 35.2 | 34.1 | 35.0 | 33.9 |
|    | 32.9 | 33.0 | 33.2 | 33.3  | 33.7 | 34.0 | 34.1 | 34.4 | 34.5 | 34.9 | 34.9 | 35.2 |      |

FIG. 4

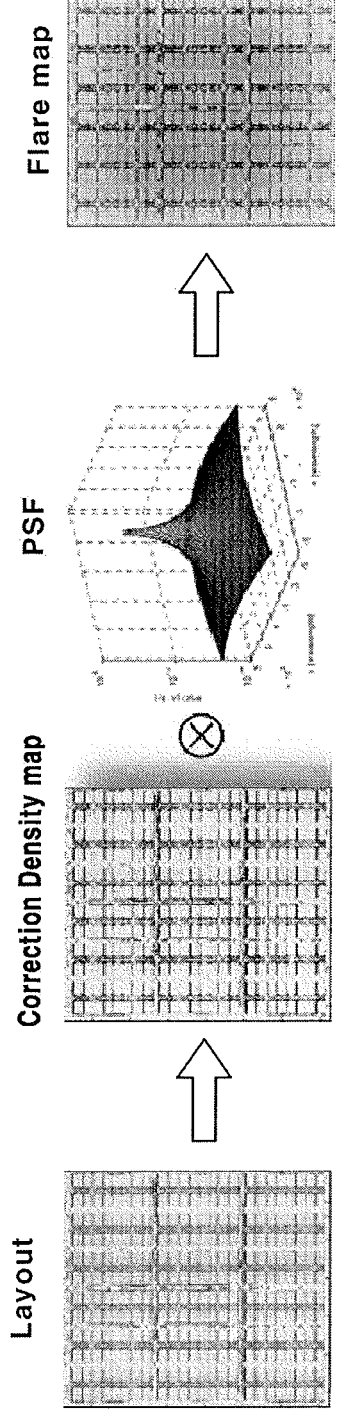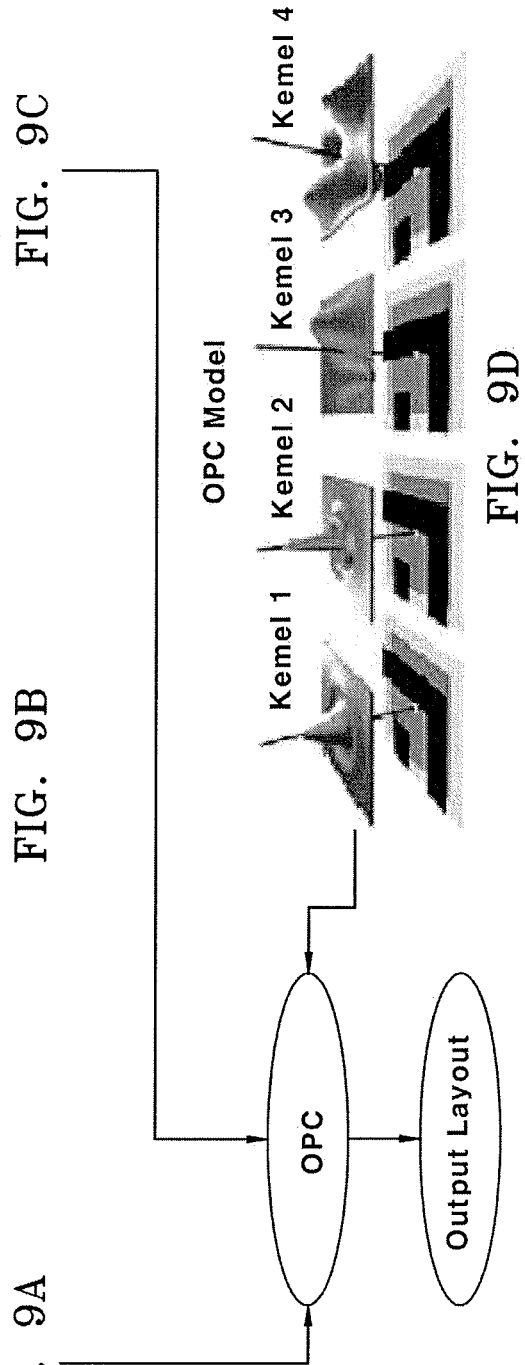

OPTICAL PROXIMITY CORRECTION (OPC) METHOD AND METHOD OF FABRICATING MASK USING THE OPC METHOD

CROSS-REFERENCE TO RELATED APPLICATION

Korean Patent Application No. 10-2015-0153259, filed on Nov. 2, 2015, and entitled, "Optical Proximity Correction (OPC) Method and Method of Fabricating Mask Using the OPC Method," is incorporated by reference herein in its entirety.

BACKGROUND

1. Field

One or more embodiments described herein relate an optical proximity correction method and a method for fabricating a mask using an OPC method.

2. Description of the Related Art

A lithography process is often used to form a circuit pattern of a semiconductor device. This process involves irradiating a light beam on a photosensitive film. The light beam may be emitted from a deep ultra violet (DUV) light source. Other light sources that may be used in this process include extreme ultraviolet (EUV) light, electron beams, X-rays, and ion beams.

As the patterns in semiconductor device become finer, an optical proximity effect (OPE) may occur during exposure. OPE may occur as a result of adjacent patterns affecting one another. In an attempt to overcome the OPE, an optical proximity correction (OPC) method may be used. This method attempts to suppress the OPE by correcting a pattern layout on a mask in a mask fabricating process.

SUMMARY

In accordance with one or more embodiments, an optical proximity correction (OPC) method includes loading a target layout for a mask; generating a correction density map based on manipulation of flare to correct global errors caused by exposing equipment; generating a flare map via convolution integration of the correction density map and a point spread function (PSF) regarding the flare; and correcting the target layout using the flare map and an OPC model.

Generating the correction density map may include defining the global errors based on a result of exposure evaluation for a wafer; calculating a flare correction amount for correcting the global errors based on a flare sensitivity (FS); generating a dummy layout having a density distribution corresponding to the flare correction amount; and calculating the correction density map based on the target layout and the dummy layout.

Defining the global errors may include measuring critical dimensions on the wafer, determining differences between CDs at respective locations of a full-shot, and trending the differences between the CDs at respective locations of the full-shot. The FS may correspond to CD variation according to a flare change (%) ($\Delta$CD/% flare), and, calculating the flare correction amount includes determining the largest CD error at the full- and calculating the flare correction amount corresponding to the largest CD error based on the FS.

Generating the dummy layout may include calculating the largest density for generating the flare correction amount and generating the dummy layout in which densities from a smallest density (%) to a largest density (%) are distributed.

Generating the correction density map may include calculating the correction density map by adding the dummy layout to the target layout or subtracting the dummy layout from the target layout. Calculating the correction density map may include applying the dummy layout to masks introduced to same exposing equipment. The global errors may include a CD variation based on locations of slits that occur due to optical characteristics of exposing equipment and a systematic error of the exposing equipment. The correction density map or the flare map may include pixels smaller than or equal to 1 μm. Exposing equipment may include extreme ultraviolet (EUV) exposing equipment or deep ultraviolet (DUV) exposing equipment.

In accordance with one or more other embodiments, a method of fabricating a mask includes performing an optical proximity correction (OPC) method for correcting global errors due to exposing equipment based on manipulation of flare; providing design data obtained via the OPC method as mask tape-out (MTO) design data; preparing mask data based on the MTO design data; and performing exposure on a substrate for a mask based on the mask data.

Performing the OPC method may include loading a target layout regarding a mask; generating a correction density map based on manipulation of flare to correct global errors due to exposing equipment; generating a flare map via convolution integration of the correction density map and a point spread function (PSF) regarding the flare; and correcting the target layout using the flare map and an OPC model.

Generating the correction density map may include defining the global errors by measuring critical dimensions on the wafer, determining differences between CDs at respective locations of a full-shot, and obtaining a trend of the differences between the CDs at respective locations of the full-shot; determining the largest CD error at the full-shot and calculating a flare correction amount for correcting the global error using a flare sensitivity (FS) corresponding to CD variation according to a flare change (%) ($\Delta$CD/% flare); calculating a largest density for generating the flare correction amount based on the flare correction amount and generating a dummy layout in which densities from a smallest density (%) to a largest density (%) are distributed; and calculating the correction density map based on the target layout and the dummy layout.

The global errors may include a CD variation based on locations of slits caused by optical characteristics of exposing equipment and a systematic error of the exposing equipment, and the correction density map may be generated by applying the dummy layout to masks introduced to same exposing equipment. Exposure may be performed on the substrate for a mask using an E-beam, and the exposing equipment may include EUV exposing equipment or DUV exposing equipment.

In accordance with one or more other embodiments, an optical proximity correction (OPC) method includes loading a target layout for a mask; generating a correction density map based on manipulation of flare to correct global errors; generating a flare map based on the correction density map; and correcting the target layout based on the flare map and an OPC model. The global errors may include ones caused by exposing equipment. Generating the flare map may include performing convolution integration of the correction density map and a point spread function regarding the flare.

The correction density map may include defining the global errors based on a result of exposure evaluation for a wafer; calculating a flare correction amount for correcting the global errors based on a flare sensitivity; generating a dummy layout having a density distribution corresponding to the flare correction amount; and calculating the correction density map based on the target layout and the dummy layout. Defining the global errors may include measuring critical dimensions on the wafer, determining differences between CDs at respective locations of a full-shot, and trending the differences between the CDs at respective locations of the full-shot.

BRIEF DESCRIPTION OF THE DRAWINGS

Features will become apparent to those of skill in the art by describing in detail exemplary embodiments with reference to the attached drawings in which:

FIG. 3 illustrates an example of critical dimension (CD) values;

FIG. 4 illustrates an example for defining global errors;

FIGS. 9A-9D illustrates example operations of an OPC method;

DETAILED DESCRIPTION

Figure 1:
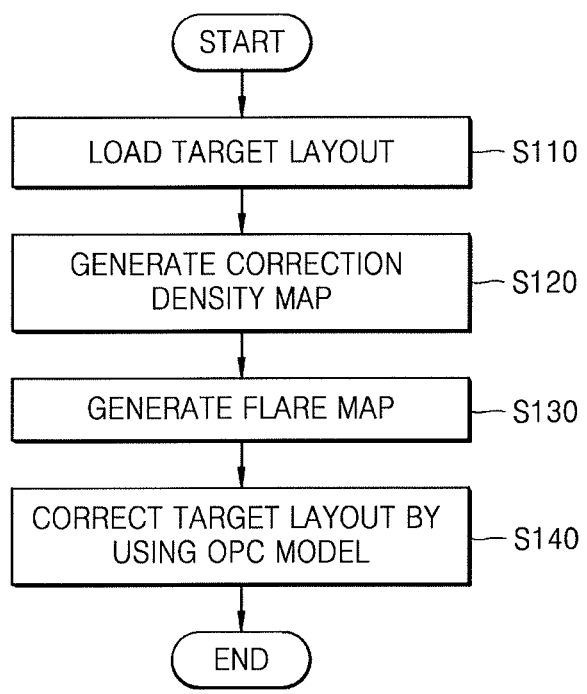
FIG. 1 illustrates an embodiment of an OPC method.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiments may be combined to form additional embodiments.

In the drawings, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Hereinafter, it will be understood that when an element or layer is referred to as being "connected to" another element or layer, the element or layer can be directly connected to the other element or layer or intervening elements or layers may be present therebetween. Similarly, it will be understood that when an element or layer is referred to as being "on" another element or layer, the element or layer can be directly on the other element or layer or intervening elements or layers may be present thereon. Sizes of elements in the drawings may be exaggerated for convenience of explanation. Like reference numerals refer to like elements throughout. The terminology used herein is for the purpose of describing particular embodiments only and is not intended to be limiting of the embodiments.

FIG. 1 illustrates an embodiment of an optical proximity correction (OPC) method which includes loading a target layout regarding a mask (operation S110). Generally, when a circuit designer designs a semiconductor device, a target layout regarding the designed semiconductor device is designed and embodied as a mask. Here, the target layout may be a physical mark formed on a mask for transferring a designed circuit onto a wafer. In one embodiment, the target layout may correspond to a circuit or an interconnection directly related to operations of a semiconductor device. When such a target layout is completed, the target layout may be provided to an OPC operator or is loaded to an OPC working computer.

The OPC method refers to a method for suppressing an optical proximity effect (OPE), which may occur during exposure as adjacent fine patterns affect one another. The OPC method suppresses OPE by correcting the layout of the patterns, e.g., the layout regarding patterns may be corrected in this OPC method instead of being used as-is as patterns on a mask.

The OPC method may include the following types: a rule-based OPC method and a simulation-based OPC or a model-based OPC.

In a rule-based OPC method, a test mask is fabricated first, and a test wafer is fabricated by transferring patterns on the test mask onto a wafer. Next, design rules are determined based on data measured with respect to the patterns formed on the test wafer and design data regarding the test mask. The design rules may be, for example, for determining bias data to be applied for designing a layout of patterns based on the measured data and the design data regarding the test mask.

Once such design rules are determined, the layout of patterns is corrected based on the design rules. Correction may be performed at the CAD stage for designing the layout of patterns. According to the rule-based OPC method, test patterns are measured with respect to all patterns that may be permitted within a design and tasks may be repeated every time a process is changed. Thus, significant time and costs may be consumed.

In a model-based OPC method, based on a result of measuring a standard test pattern prepared in advance (e.g., a representative pattern), kernels are generated representing transferring processes by taking into account optical proximity effect (OPE), the difference between the shape of a pattern of a mask and the shape of a pattern transferred to a wafer is obtained via a simulation using a process model comprising the kernels, and the layout of a pattern is corrected based on a result of the simulation. Since it is not necessary to measure a large number of test patterns according to the model-based OPC method, the model-based OPC method may be efficient in terms of cost and time. However, it may be difficult to accurately reflect effects based on the density of patterns, shapes, and/or distances of adjacent patterns.

The OPC method may include not only a method for modifying the layout of patterns, but also a method for adding sub-lithographic features (e.g., referred to as serifs) to corners of a pattern or a method for adding sub-resolution assist features (SRAFs) such as scattering bars. Serifs may refer to rectangular features at corners of a pattern that sharpen corners of a pattern finally transferred to a wafer. Serifs may also be used at intersection areas between different patterns to compensate for distortion factors due to the intersection of the different patterns.

A SRAF may be smaller than the resolution of exposing equipment and may not transferred to a resist layer. For example, a SRAF is not a pattern actually formed on a wafer. If patterns form a high density area and a low density area, the areas having different densities may have different diffraction patterns. Thus, there may be deviation due to OPC. A SRAF may be, for example, an assist pattern for resolving an OPC deviation due to a difference between densities of patterns.

After a target layout is loaded, a correction density map related to the target layout is generated (operation S120). The correction density map may be a density map generated by taking into account both a target layout and a dummy layout. For example, in the OPC method according to one embodiment, a dummy layout for manipulating flare may be generated to correct a global error due to exposing equipment. Then, a density map may be generated by adding the dummy layout to a target layout. (A density map regarding a target layout may be referred to as a 'basic density map.' and a density map generated by taking into account both a target layout and a dummy layout may be referred to as a 'correction density map.')

For example, global errors may include a critical dimension (CD) variation based on locations of slits formed due to optical characteristics of exposing equipment and a systematic error of the exposing equipment. The exposing equipment may include, for example, extreme ultraviolet (EUV) exposing equipment or deep ultraviolet (DUV) exposing equipment. In some cases, only systematic error of exposing equipment may be considered to be a global error. However, since a CD variation based on locations of slits is due to characteristics of exposing equipment, the CD variation will also be included in global errors discussed below.

Flare may refer to deformation of a resist pattern due to an erroneous exposure or contrast degradation due to light scattering at a defect on a surface of a lens or a mirror. Defects on the surface of a lens may include, for example, surface contamination, scratches, or local refraction index variations. The greater the amount of flare, the more significant the distortion of a pattern may be. In order to reduce distortion, it is desirable to reduce flare. However, there are limits to manufacturing a perfect reflection mirror. Furthermore, since flare varies depending on the sizes and densities of patterns, there are limits to reducing flare to below a certain amount.

Meanwhile, although it may be desirable to reduce an absolute amount of flare, a technique for fabricating a mask for reducing distortion of a pattern due to flare, as much as possible, may be used to overcome the limits of exposing equipment. In this technique, amounts of flare are quantized according to sizes and densities of patterns.

Flare may be classified as short-range flare, middle-range flare, and long-range flare. Short-range flare may refer to flare that has an effect on distance within several μm. Middle-range flare may refer to flare that has an effect on distance from several μm to dozens of μm. Long-range flare refers to flare that has an effect on a greater distance, e.g., equal to or greater than 10 mm. The aforementioned classifications of flare are merely examples. Flare may be classified according to other criteria. For example, flare may be classified according to causes of flare or different distance criteria.

An example of a method for measuring flare is the Kirk's method, also known as the pad disappearing method. The Kirk's method involves calculating flare by calculating the exposure amount regarding an arbitrary mask pattern to be screened from light, or the exposure amount corresponding to a case where patterns on a wafer disappear due to excessive exposure. To mathematically express the Kirk's method, if exposure energy to be applied to a photoresist having threshold energy E0 for making pads of various sizes disappear is denoted as E, an amount of flare may be defined as $(E0/E)*100(\%)$.

In accordance with the present embodiment, the OPC method employs a mechanism for correcting global errors due to exposing equipment by artificially manipulating flare. To briefly describe the OPC method according to the present embodiment, a dummy layout is generated based on a correlation between a flare change and a CD variation and a correlation between the flare change and a density change. A correction density map is then generated by adding the dummy layout to a target layout. Furthermore, a flare map is generated based on the correction density map, and OPC is performed using the flare map and an OPC model. Thus, global errors due to exposing equipment may be corrected.

After the correction density map is generated, a flare map is generated (operation S130). The flare map may be generated, for example, through a convolution integration of the correction density map and a point spread function (PSF) regarding flare. PSF is a function that defines flare, may be obtained from a surface roughness of a mirror constituting exposing equipment, and may approximately be, for example, $1/r^{N+1}$, that is, a fractal function. Here, r denotes a distance from a light source and N is a real number. In other words, the PSF is inversely proportional to a distance r to the power of N+1, where flare may exert an effect on a large distance from several mm to dozens of mm based on a technique for machining the surface of the mirror.

If a particular geometric structure is determined, flare may be represented by a PSF. In other words, flare may be represented by a PSF by measuring flare according to distances according to Kirk's method and obtaining its trend. When a PSF is calculated as described above, a flare map may be generated through a convolution integration between the correction density map and the PSF, as described above.

After the flare map is generated, the target layout is corrected based on a simulation using the flare map and an OPC model (operation S140). The OPC model may include a plurality of kernels representing transferring process by taking into account OPE, for example. A variety of known methods may be used to perform an OPC using a flare map and an OPC model. Since an OPC model is used in operation S140 for correcting the target layout, operation S140 for correcting the target layout may also be referred to as an OPC performing operation. (The term 'OPC method' may be distinguished from the 'OPC performing operation' and includes from operation S110 for loading the target layout to operation S140 for correcting the target layout).

In the OPC method according to the present embodiment, a dummy layout may be generated based on the flare concept, a correction density map and a flare map may be generated using the dummy layout, and an OPC is performed using the flare map and the OPC model. Thus, global errors due to exposing equipment may be corrected. Furthermore, the OPC method according to the present embodiment uses a dummy layout. Thus, the number of calculations for performing an OPC may be reduced. For example, generation of a flare map by taking into account a dummy layout may take less than or equal to an hour. However, since generation of a flare map may be performed in advance, generation of the flare map may not affect the time period for performing an OPC. Furthermore, the OPC method according to the present embodiment may use a correction density map including pixels smaller than or equal to 1 μm. Thus, global errors may be corrected at a high precision.

Figure 2:
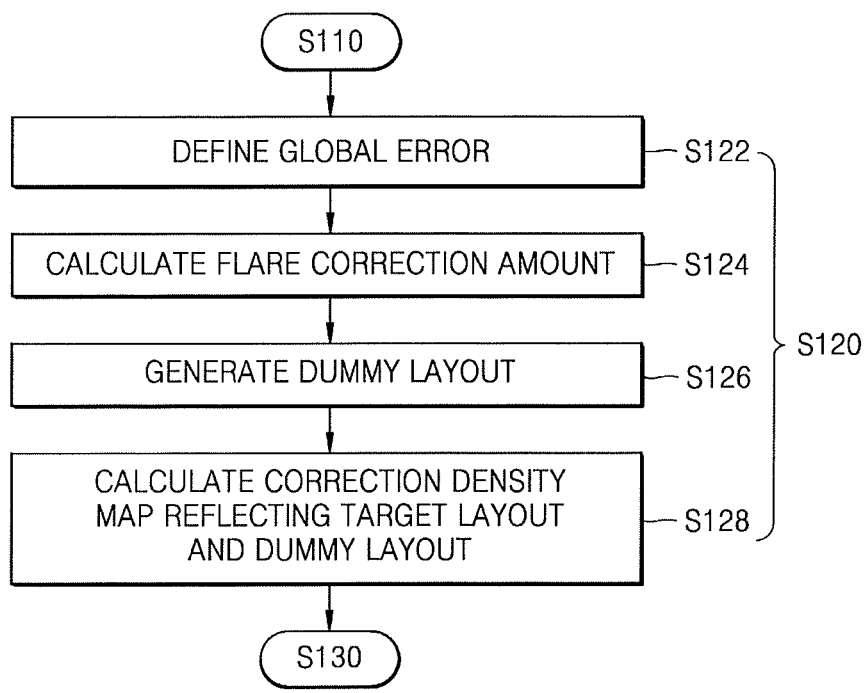
FIG. 2 illustrates an embodiment for generating a correction density map.

FIG. 2 illustrates an embodiment for generating the correction density map in the OPC method of FIG. 1. For convenience of explanation, descriptions below will be given with reference to FIGS. 3 through 8B.

Referring to FIG. 2, operation S120 for generating a correction density map may include operation S122 for defining global errors, operation S124 for calculating a flare correction amount, operation S126 for generating a dummy layout, and operation S128 for calculating a correction density map.

As described above, global errors may include CD variation based on locations of slits formed due to optical characteristics of exposing equipment and a systematic error of the exposing equipment. For example, in the case of a lithography operation using light of a short wavelength (e.g., EUV light corresponding to a wavelength of about 13.5 nm), CD variation may occur differently during actual wafer exposure due to optical characteristics of exposing equipment, such as aberration, apodization, or pupil apodization. Furthermore, CD variation may occur due to a systematic error of exposing equipment. Since such global errors are caused by characteristics of exposing equipment, the global errors may occur in all masks used with the same exposing equipment in the same manner. A specific example of global errors is shown in FIG. 3.

FIG. 3 illustrates an example of a table showing CD values of patterns measured in horizontal directions around a slit at an area corresponding to a full-shot. The horizontal directions may indicate directions in which the slit extends (or both ends of the slit are connected). Vertical directions may indicate directions perpendicular to or crossing the directions in which the slit extends.

The numbers 1 through 12 at the top of the table indicate locations in the directions in which the slit extends. The numbers 1 through 30 at the left of the table only indicate locations in the vertical directions. CD values respectively corresponding to the locations in the directions in which the slit extends and the respective locations in the vertical directions are shown in units of nm. The bottommost CD values are average CD values at respective locations in the directions in which the slit extends. The rightmost CD values are average CD values at respective locations in vertical directions.

As shown in the table, CD values change in the horizontal directions around the slit. For example, the CD values increase in a horizontal direction to the right at the 13th row. Furthermore, the average CD values at the bottom also increase in the horizontal direction to the right. The difference between the leftmost average CD value and the rightmost average CD value is about 2.3 nm. Such differences between the leftmost CD values and the rightmost CD values in the horizontal directions may correspond to global errors caused by optical characteristics of exposing equipment and a systematic error of the exposing equipment.

Although a dose modulation method or a mask process correction (MPC) method has been used to resolve global errors of exposing equipment, such methods are very inaccurate because correction is performed from every one of dozens of μm to hundreds of μm. Furthermore, these methods may be only applied to border areas of a full-shot and may not be applied to the entire full-shot area. The dose modulation method involves dividing a full-shot into a plurality of cells (e.g., cells having a size of 256*256 μm² each) and equally adjusting the dose of an e-beam with respect to selected cells. The MPC method involves applying a bias voltage to every one of dozens of μm during irradiation of an e-beam.

A full-shot may correspond to an entire mask pattern transferred through a single scanning. An EUV exposure operation may be performed via a reduced projection, e.g., 4:1 reduced projection. Therefore, a mask pattern may be reduced to ¼ of its size and transferred to a wafer. Since the mask pattern is reduced and transferred, the full-shot may correspond to ¼ of the size of the entire mask pattern. Here, ¼ is a reduction ratio regarding a length and may correspond to a 1/16 reduction of an area. Full-shot may also be referred to as a full-field.

In the OPC method according to the present embodiment, an artificial flare manipulation may be used to correct global errors. For artificial flare manipulation, global errors are trended and defined (operation S122). For example, global errors may be defined by measuring CDs on a wafer, determining differences between CDs at respective locations of a full-shot, and obtaining a trend of the differences between CDs at the respective locations of the full-shot. For example, since FIG. 3 shows that CD gradually increases in a horizontal direction to the right (e.g., a horizontal direction to the right of a slit), it may be trended that the density of patterns at the left portion of the slit is high and the density of patterns at the right portion of the slit is low.

Figure 4:
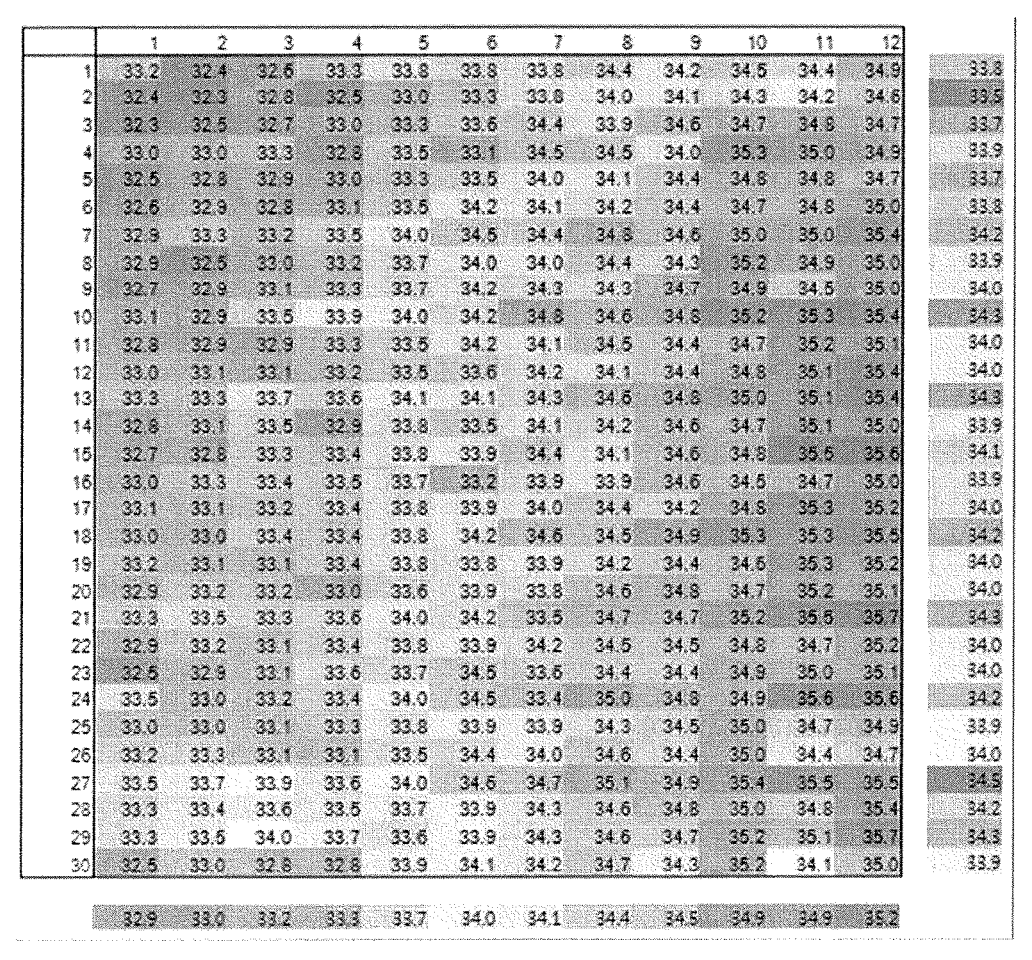

FIG. 4 illustrates an example for defining global errors where densities respectively corresponding to CD values are trended by being indicated with different shading. For example, since CD values at the left portion of the table are relatively small, the CD values correspond to high pattern densities and are indicated with relatively dark shading. Since CD values increase to the right, the CD values correspond to low pattern densities and are indicated with relatively light shading. Accordingly, global errors may be defined by evaluating a wafer, that is, measuring CDs on the wafer, and obtaining a trend of differences between CDs at respective locations.

When global errors are defined, flare correction amount may be calculated using flare sensitivity (FS) (operation S124) defined by Equation 1.

$$FS = \Delta CD/\% \text{ flare} \qquad (1)$$

Thus, FS may be defined as a CD variation amount corresponding to 1% variation of flare. For example, if CD varies by about 2 nm in correspondence to 2% variation of flare, FS may be calculated as 1 (nm/%).

To calculate flare correction amount, the largest CD error in global errors may be determined. For example, in FIG. 3 or FIG. 4, since the largest difference between average CD values at the respective locations of a slit is 2.3 nm, the largest CD error may be considered to be 2.3 nm. The flare correction amount for correcting the largest CD error may be calculated as 2.3% based on the FS. For example, if flare is manipulated by 2.3%, a CD value may be changed by about 2.3 nm. For convenience of calculation, it is assumed that the largest CD error is 2 nm and the flare correction amount is 2%.

After the flare correction amount is calculated, a dummy layout is generated (operation S126). To describe the generation of the dummy layout, a largest density for generating a flare correction amount is calculated. For example, if the range of flare of corresponding exposing equipment is from 0% to 4% and the range of densities is from 0% to 100%, the density corresponding to a particular flare may be calculated based on a proportional relation. For example, 2% flare may correspond to 100*2/4=50% density. Here, 0% flare may correspond to 0% density (e.g., closed state), whereas 4% flare may correspond to 100% density, e.g., open state. When the largest density is calculated, a dummy layout is generated in which densities from the smallest density to the largest density are distributed.

Figure 5:
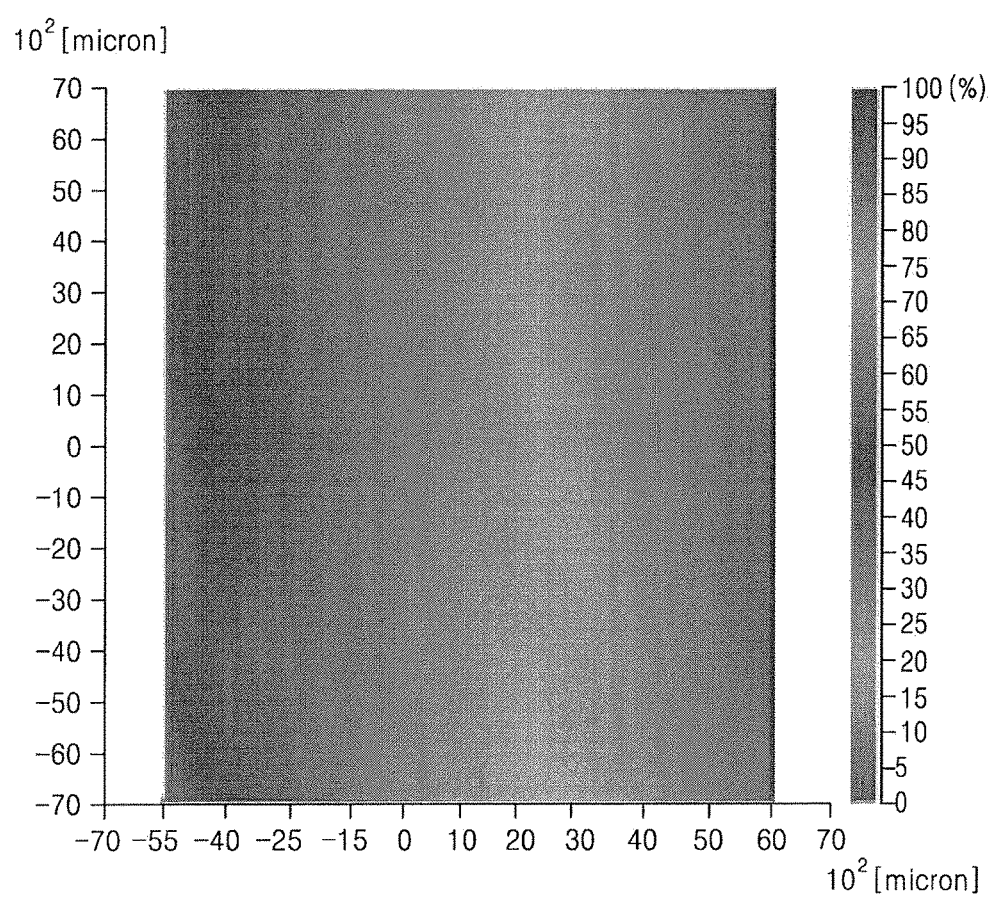
FIG. 5 illustrates an example of a dummy layout for compensating global errors.

FIG. 5 illustrates an example for a dummy layout to compensate for the global errors in FIG. 4. In the dummy layout, densities from the smallest density to the largest density are distributed as described above. For example, in FIG. 4, there is a CD error up to about 2 nm at the right. A flare correction amount of 2% may correct the CD error. The flare correction amount of 2% may correspond to 50% density. Therefore, by increasing the density at the right by 50%, the CD error of about 2 nm at the right may be removed.

When the concept is applied to an entire full-shot, CD errors defined as global errors are from 0 nm to 2 nm in a direction from the left to the right, where flare correction amounts corresponding thereto may be from 0% to 2%. Furthermore, in correspondence to a flare correction amount, it may be necessary to increase a density from 0% to 50%. Therefore, by generating a dummy layout having a distribution of densities from 0% to 50% in a direction from the left to the right and adding the dummy layout to a target layout, global errors of an entire full-shot may be removed.

FIG. 5 illustrates that the right-end portion is indicated with shading corresponding to 0% density, density increases in a left direction. The left-end portion is indicated with shading corresponding to almost 50% density.

Figure 6A:
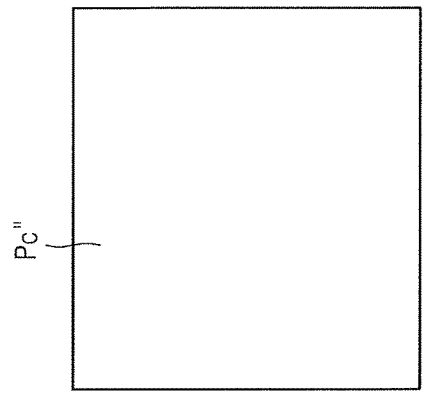
FIGS. 6A-6C illustrate examples of dummy patterns.
Figure 6B:
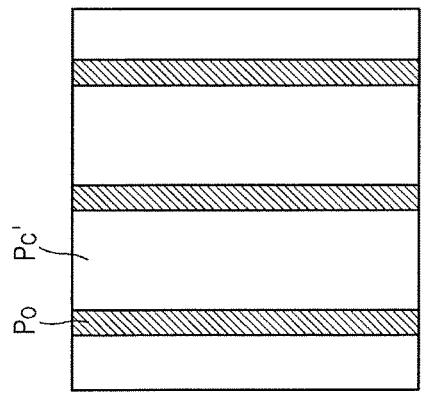
Figure 6C:
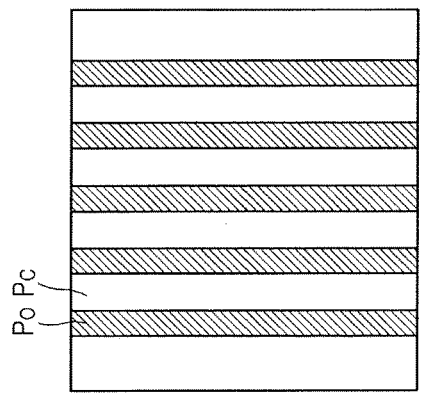

FIGS. 6A-6C illustrate examples of dummy patterns according to densities that may be included in a dummy layout. FIG. 6A illustrates dummy patterns Po corresponding to 50% density. FIG. 6B illustrates dummy patterns Po corresponding to 25% density. FIG. 6C illustrates dummy patterns Po corresponding to 0% density. The dummy patterns Po correspond to open portions of a mask. Portions Pc, Pc', and Pc" between the dummy patterns Po may correspond to closed portions of the mask. In FIG. 6C, the entire mask may be closed in correspondence to 0% density, e.g., no dummy pattern may be formed.

After the dummy layout is generated, a correction density map reflecting both the target layout and the dummy layout is calculated (operation S128).

Figure 7A:
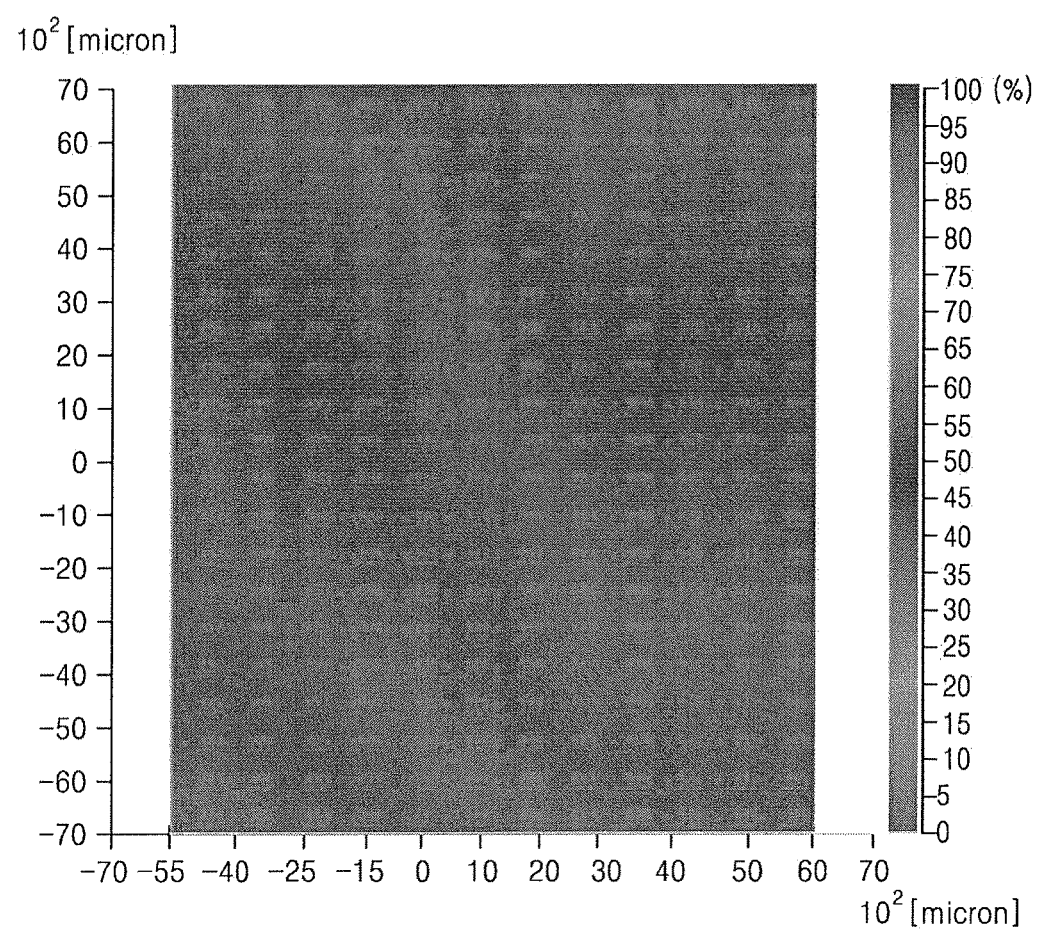
FIGS. 7A and 7B illustrate examples of a basic density map.
Figure 7B:
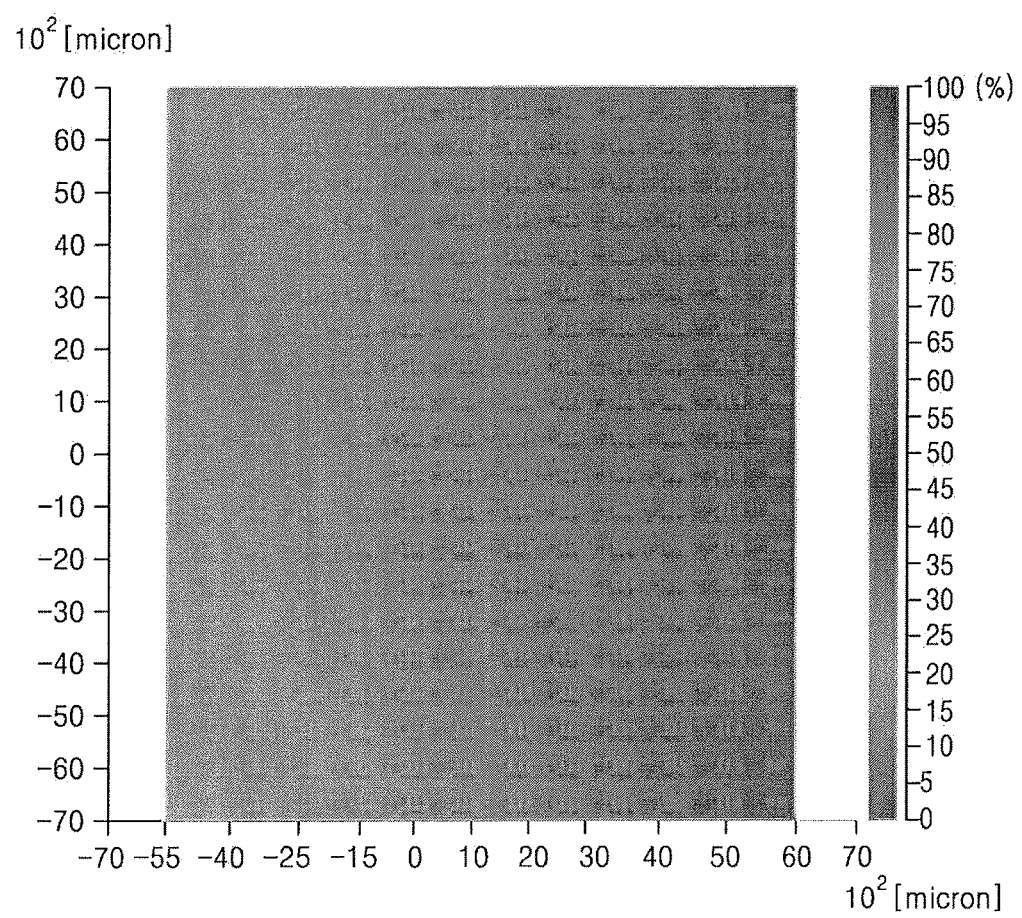

FIG. 7A illustrates an example of a basic density map regarding a target layout, and FIG. 7B illustrates an example of a correction density map generated by adding a dummy layout to the target layout. As shown in FIGS. 7A and 7B, the basic density map may have a uniform density throughout a full-shot. The reason is because the target layout is designed to have a uniform density throughout. For example, the target layout may include dummy patterns to have a uniform density. On the other hand, unlike the basic density map of FIG. 7A, a density map regarding an actual target layout may not be uniform with respect to an entire full-shot and there may be some deviation.

In performing OPC based on a basic density map, global errors occur during an actual exposure operation of a wafer due to errors of exposing equipment, as described above. In an attempt to correct global errors in accordance with one embodiment, a correction density map is generated by adding a dummy layout to a target layout in the OPC method. Adding a dummy layout to a target layout only means including densities of the dummy layout in densities of the target layout for generating a correction density map. Therefore, the dummy layout is only used for calculating the correction density map and is not actually added to the target layout. Accordingly, the dummy layout may not affect the target layout.

As shown in FIG. 7B, the correction density map is generated by adding the dummy layout to the target layout. The left portion of the correction density map may exhibit higher densities than the right portion of the correction density map. For example, in the dummy layout of FIG. 5, the left portion of the dummy layout exhibits a high density of almost 50%, whereas the right portion of the dummy layout exhibits a density of almost 0%. Therefore, if the correction density map is simply calculated under an assumption that the target layout has a uniform density of about 30%, the correction density map may have a density distribution in which the density at the left portion of the correction density map is about 80% and the density at the right portion of the correction density map is about 30%.

In another embodiment, a correction density map may be generated by subtracting a dummy layout from a target layout. To describe this embodiment, in the table of FIG. 3, if it is considered that a CD error of −2 nm occurs at CD values at the left portion of the table, a flare correction amount of −2% may correct the CD error. The flare correction amount of −2% may correspond to −50% density. Therefore, by reducing the density of the left portion by 50%, the CD error of about −2 nm at the left portion of the table may be removed. Calculation of a correction density map via addition/subtraction of a dummy layout may involve performing, for example, OR/NOT calculations.

After the correction density map is generated, a flare map is generated using the correction density map described above with reference to FIG. 1 (operation S130).

Figure 8A:
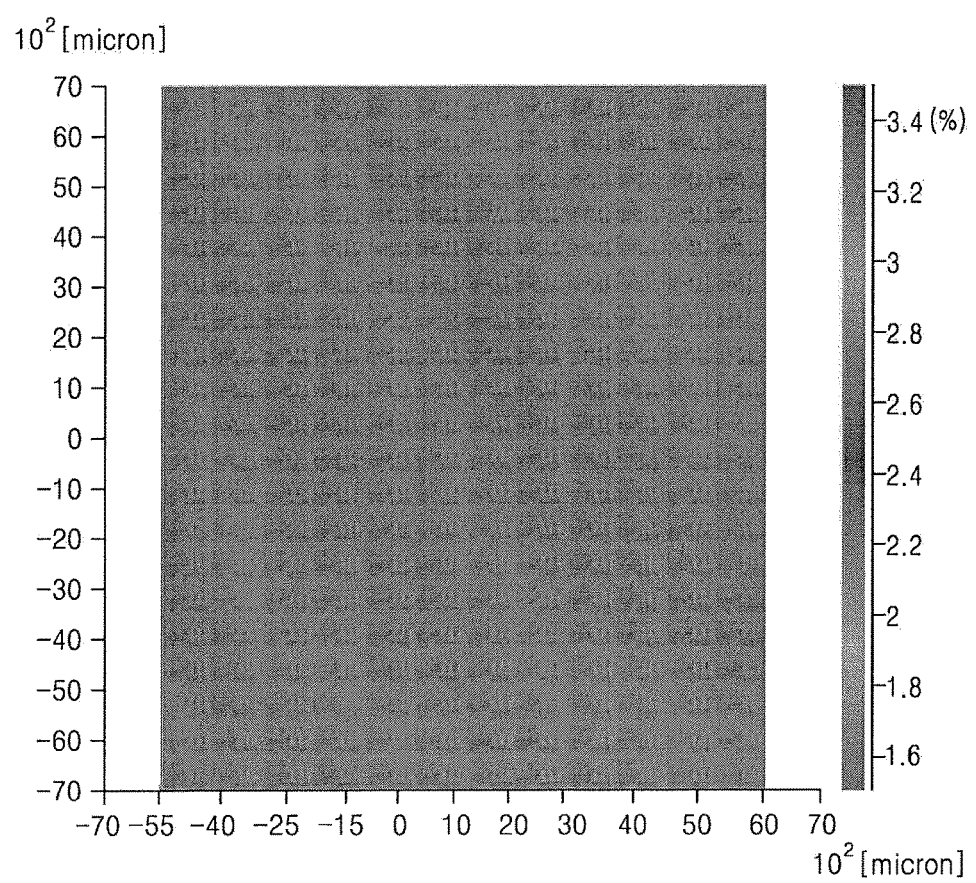
FIGS. 8A and 8B illustrate examples of a flare map.
Figure 8B:
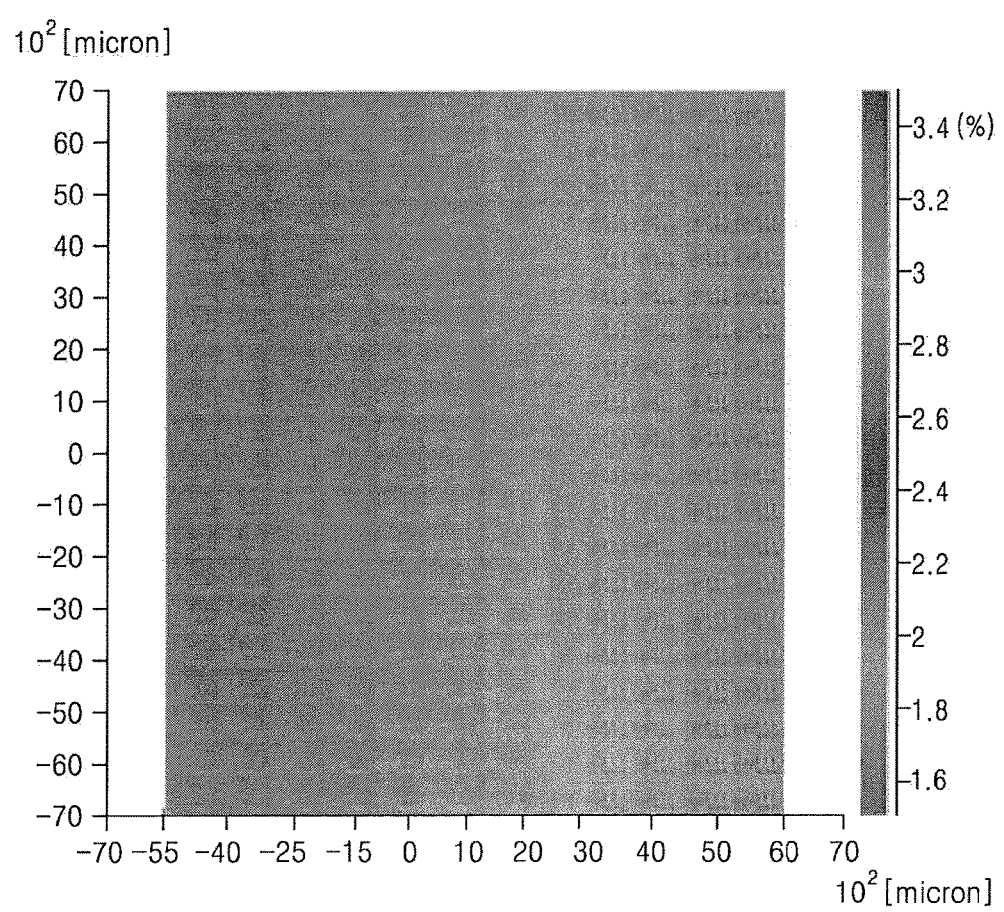

FIG. 8A illustrates an example of a flare map regarding a basic density map, and FIG. 8B illustrates an example of a flare map regarding a correction density map. In FIG. 8A, the flare map is generated via convolution integration of a basic density map (e.g., in FIG. 7A and a PSF. In FIG. 8B, the flare map generated via convolution integration of a correction density map (e.g., in FIG. 7B) and the PSF.

The flare map in FIG. 8A has a uniform flare amount throughout an entire full-shot. However, this is merely for convenience of explanation. There may be deviations in actual flare amounts. Deviations regarding a flare map may be caused, for example, by a PSF. However, if a basic density map regarding a target layout is not uniform, the basic density map may also contribute to deviations of a flare map.

If it is assumed that a flare map regarding a target layout is uniform, as in FIG. 8A, since the density distribution of a correction density map is not uniform, a flare map regarding the correction density map is not uniform, as in FIG. 8B. Therefore, the flare map regarding the correction density map becomes different from the flare map in FIG. 8A. If the flare map of FIG. 8A is considered to be a flare map generated based on pure flare of exposing equipment, the flare map of FIG. 8B may be considered to be a flare map generated by artificially manipulating flare of the exposing equipment. Therefore, the OPC method according to the present embodiment may effectively and precisely correct global error due to exposing equipment via an artificial manipulation of flare, by generating a dummy layout and generating a dummy density map and a flare map based on the dummy layout.

FIGS. 9A-9D illustrate example operations of an OPC method according to an embodiment. Referring to FIG. 9A, a target layout regarding a mask is designed and loaded to a computer for performing an OPC. Next, a correction density map is generated, for example, by generating a dummy layout based on the flare concept and considering densities of the target layout and the dummy layout together.

Referring to FIG. 9B, the correction density map and a PSF are convolution integrated. In FIG. 9B, ⓧ is a mathematical symbol denoting a convolution integration.

Referring to FIG. 9C, a flare map is generated via the convolution integration of the correction density map and the PSF. Next, an OPC is performed using a flare map and an OPC model.

Referring to FIG. 9D, the OPC model includes a plurality of kernels. The target layout is corrected by performing OPC. When OPC is completed, data regarding a mask layout is output. The data regarding a mask layout is mask tape-out (MTO) design data and is provided to a mask fabrication team.

Figure 10:
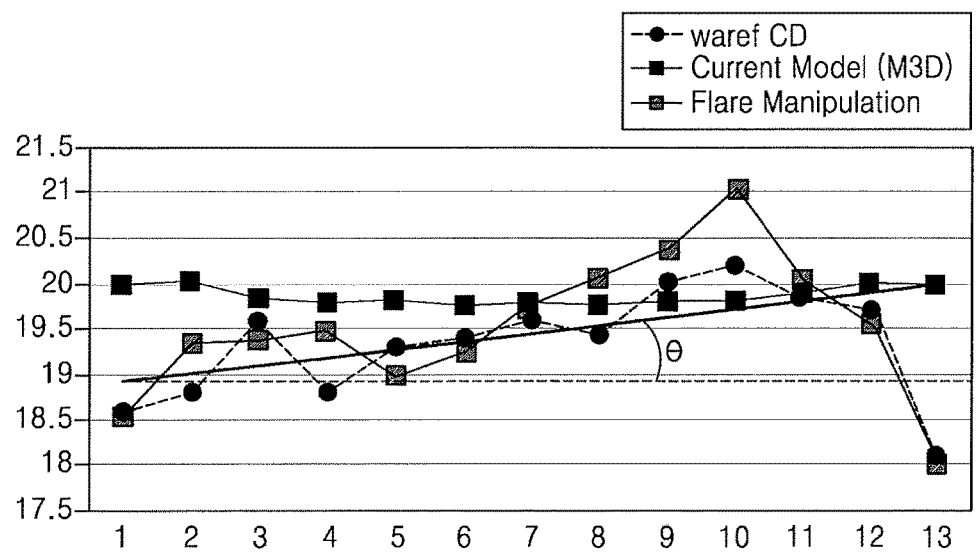
FIG. 10 illustrates examples of results of a proposed OPC method and the OPC method of FIG. 1.

FIG. 10 is a graph illustrating a comparison between a result obtained using a proposed OPC method and a result obtained using the OPC method of FIG. 1. In FIG. 10, black circles (wafer CDs) indicate actual CDs of a wafer, black squares (current model (M3D)) indicate model CDs or simulated CDs obtained using a the proposed OPC method, and gray squares (flare manipulation) indicate model CDs obtained using the OPC method according to the present embodiment. The x-axis indicates respective locations of a slit (no unit), and the y-axis indicates CDs in units of nm.

Referring to FIG. 10, the model CDs obtained using the proposed OPC method are significantly different from the actual CDs of a wafer. The model CDs obtained by the proposed OPC method are similar to one another throughout an entire slit. However, as shown in FIG. 10, the actual CDs of the wafer may be relatively small at edges of the wafer, and particularly at the right edge. Therefore, the model CDs obtained using the proposed OPC method may not represent actual patterns on the wafer. Meanwhile, as described with reference to FIG. 3, the actual CDs of the wafer may include global errors having a slope indicated with θ.

In the case of the model CDs obtained using the OPC method according to the present embodiment, CDs become small at edges of the wafer in a fashion similar to that of the actual CDs on the wafer. Furthermore, global errors occurring in horizontal directions around a slit are also reduced. Therefore, by artificially manipulating flare by generating a dummy density map and a flare map and performing an OPC based on the flare map and an OPC model, actual patterns on a wafer may be precisely represented and global errors due to exposing equipment may be corrected.

Also, in the case of model CDs according to the proposed OPC method, the largest CD error is 1.88 nm, the error range is 2.28 nm, and the root mean square (RMS) is 0.83 nm. On the other hand, in the case of model CDs according to the OPC method according to the present embodiment, the largest CD error is 0.79 nm, the error range is 1.10 nm, and the RMS is 0.40 nm. Therefore, the OPC method according to the present embodiment represents an actual pattern on a wafer more precisely than the proposed OPC method.

Figure 11A:
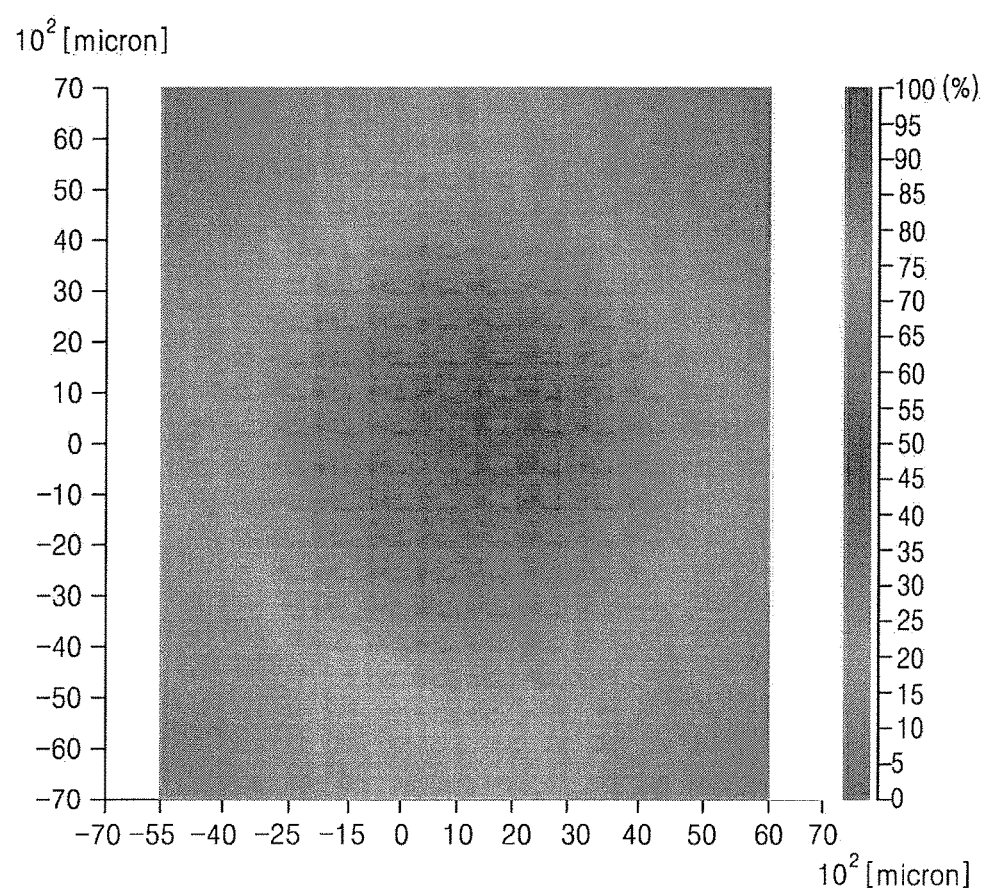
FIGS. 11A and 11B illustrate examples of a dummy layout different from FIG. 5 and a flare map based on the dummy layout.
Figure 11B:
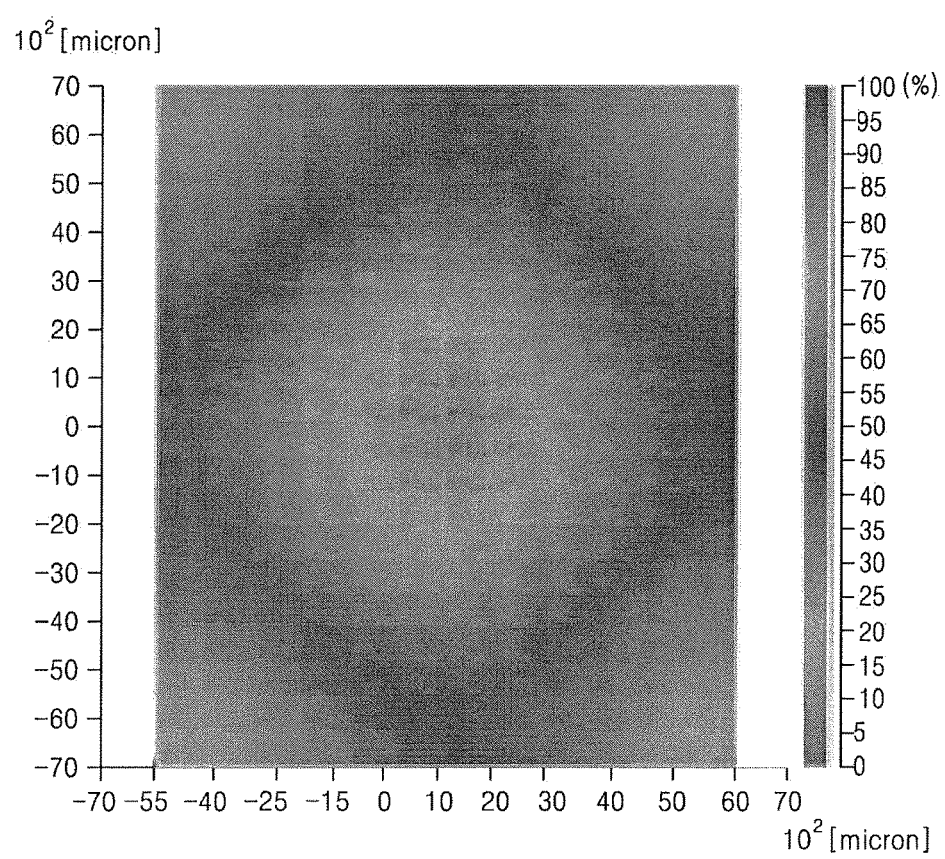

FIG. 11A illustrates an example for a dummy layout different from that of FIG. 5, and FIG. 11B illustrates an example of a flare map based on the dummy layout of FIG. 11A. According to the OPC method of the present embodiment, a dummy layout may be generated not only based on the global error pattern in FIG. 3, but also based on global error patterns of various other forms. Furthermore, a correction density map and a flare map may be generated using the generated dummy layout. Therefore, according to the OPC method according to the present embodiment. OPC is performed by generating a suitable flare map in correspondence to global error patterns of various patterns, thereby correcting global errors of various forms.

The dummy layout pattern, as shown in FIG. 11A, may be caused, for example, by an optical density (OD) phenomenon or an out-of-band (OOB) phenomenon. In an OD phenomenon, light is reflected by an outer area of a mask, which is not supposed to reflect light, other than the cell area of the mask. In an OOB phenomenon, incident light includes wavelengths outside a certain wavelength range.

Figure 12:
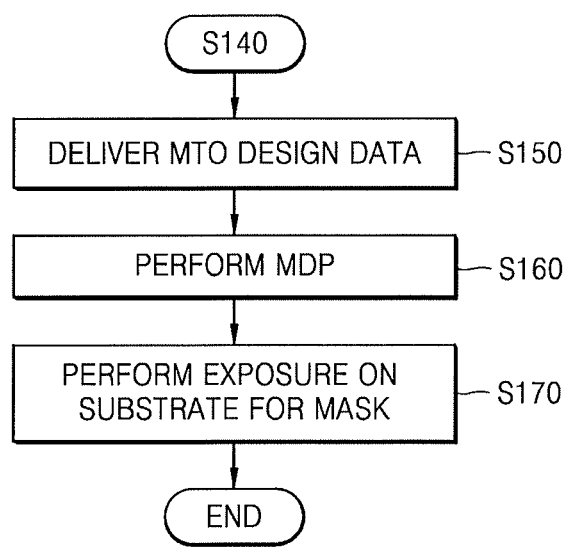
FIG. 12 illustrates an embodiment of a method for fabricating a mask.

FIG. 12 illustrates an embodiment of a method for fabricating a mask. Referring to FIG. 12, after an OPC performing operation (operation S140), that is, operation S140 for correcting a target layout, data obtained by performing OPC is delivered as mask tape-out (MTO) design data. The MTO may refer, for example, to requesting fabrication of a mask by providing data regarding an OPC-completed mask layout to a mask fabricating team. Therefore, MTO design data may be considered to be data regarding an OPC-completed mask layout. Such MTO design data may have a graphic data format used in electronic design automation (EDA) software. For example, MTO design data may have a data format like GDS or OASIS.

After providing the MTO design data, a mask data preparation (MDP) is performed (operation S160). The MDP may include a format conversion, an augmentation, and a verification. The format conversion, also referred to as fracturing, may refer to an operation for fracturing MTO design data into a plurality of sections and converting the format of the MTO data into a format for e-beam exposing equipment. The fracturing may include data manipulations including scaling, data sizing, data rotation, pattern reflection, color inversion, etc.

During a format conversion, data regarding a large number of systematic errors, that may occur during a process for transferring design data to an image on a wafer, may be corrected. The data correcting operation regarding systematic errors, also referred to as a mask process correction (MPC), may include, for example, a line width adjustment, which is referred to as a CD adjustment, and a task for improving the precision of a pattern arrangement. Therefore, a format conversion may contribute to improvement of the quality of a final mask and may be an operation performed in advance for a MPC. The systematic errors may be caused, for example, by distortions formed during an exposure operation, a mask developing operation, a mask etching operation, a wafer imaging operation, etc.

The augmentation may include augmentations of a barcode for mechanical recognition, a label that may be recognized by a human, an aim mark, a job deck, etc. Augmentation of a job-deck may indicate, for example, generation of a text file including a series of commands regarding an arrangement of multi mask files, a reference dose, an exposure speed or an exposure method, etc. Verification may include, for example, both an automatic verification and a manual verification.

After the MDP is performed, exposure is performed on a substrate for a mask (operation S170). The exposure may refer to an e-beam writing operation, for example. The e-beam writing operation may be performed as a gray writing operation using a multi-beam mask writer (MBMW), for example. Furthermore, the e-beam writing operation may also be performed using a variable shape beam (VSB) exposing equipment. In one embodiment, the exposure may refer to a laser beam exposure.

A data processing operation may be performed before the exposure. The data processing operation is a pre-processing operation regarding mask data and may include a grammar check operation and an exposure time prediction regarding the mask data.

After a mask data preparing operation, an operation for transforming mask data to pixel data may be performed before the exposure. Pixel data is data directly used for an actual exposure and may include data regarding shapes to be exposed and data regarding doses allocated to the respective shapes. The data regarding shapes may be, for example, bitmap data generated by converting shape data, which is vector data, via rasterization.

After the exposure, a mask is formed by performing a series of operations. The series of operations may include, for example, a developing operation, an etching operation, a cleaning operation, a baking operation, etc. The series of operations for forming a mask may include, for example, a measuring operation, a defect checking operation, or a defect fixing operation. The series of operations for forming a mask may further include a pellicle applying operation. The pellicle applying operation may refer to an operation for attaching pellicles on surfaces of a mask to protect the mask from subsequent contamination during delivery of the mask or the lifespan of the mask once it is checked during a final washing and inspecting operation that there is no contaminating particles or chemical stain on the surfaces of the mask.

The method of fabricating a mask according to the present embodiment includes an OPC method of generating a dummy layout based on the flare concept, generating a correction density map and a flare map by using the dummy layout, and performing an OPC by using the flare map and an OPC model. Thus, an excellent mask for preventing the occurrence of global errors due to exposing equipment may be fabricated.

Figure 13:
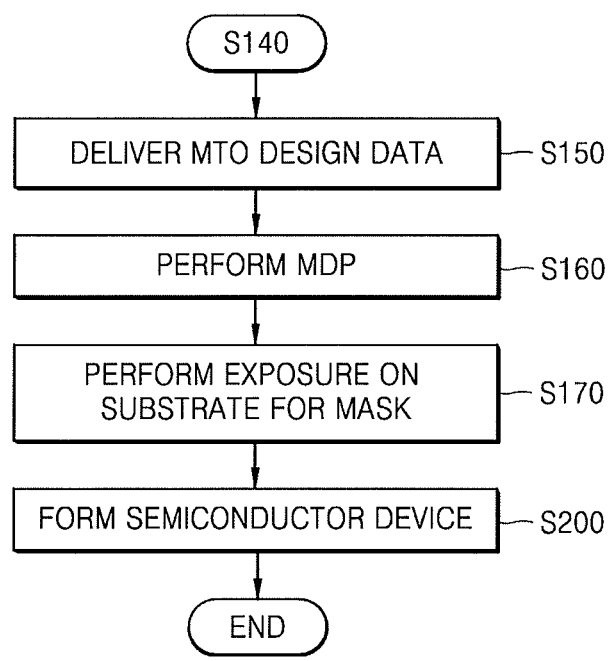
FIG. 13 illustrates an embodiment of a method for fabricating a semiconductor device.

FIG. 13 illustrates an embodiment of a method for fabricating a semiconductor device. Referring to FIG. 13, the method includes fabricating a mask by performing operations as described above with reference to FIG. 12. In other words, a mask is fabricated by performing the operations from operation S110 for loading a target layout to operation S170 for performing an exposure on a substrate for a mask.

After the mask is fabricated, a semiconductor device is formed by performing various semiconductor fabricating operations onto a semiconductor substrate, such as a wafer, using the fabricated mask (operation S200). A representative example of semiconductor fabricating operations using a mask may be a patterning operation based on a lithography operation. Through such a patterning operation using a mask, a desired pattern may be formed on a semiconductor substrate or a material layer. A lithography operation may be performed using exposing equipment for EUV light or DUV light.

Semiconductor fabricating operations may include, for example, a deposition operation, an etching operation, an ion operation, and a cleaning operation. The deposition operation may include one of various material layer forming operations, e.g., VD operation, sputtering operation, and spin coating operation. The ion operation may include, for example, an ion implanting operation, an ion diffusing operating, a heat treatment operation, etc. Semiconductor fabricating operations may include, for example, a packaging operation for mounting a semiconductor device on a PCB and sealing the same using a sealant or a testing operation for testing a semiconductor device or a semiconductor package.

In a method of fabricating a semiconductor device according to an embodiment, a lithography operation is performed using an excellent mask for preventing occurrence of global errors due to exposing equipment as described above. Thus, a high performance semiconductor device including ultra-fine patterns may be fabricated.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods herein.

The equipment used to perform the embodiments described herein may be implemented in logic which, for example, may include hardware, software, or both. When implemented at least partially in hardware, the equipment may be, for example, any one of a variety of computer systems or other processing systems.

When implemented in at least partially in software, the equipment may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

By way of summation and review, an OPC method according to one or more embodiments includes generating a dummy layout based on the flare concept. A correction density map and a flare map are generated using the dummy layout and an OPC is performed using the flare map and the OPC model. Thus, global errors due to exposing equipment may be corrected. Furthermore, an OPC method according to one or more embodiments has a reduced number of calculations for performing OPC. Furthermore, an OPC method according to one or more embodiments uses a correction density map including pixels smaller than or equal to 1 μm. Thus, global errors may be corrected at a high precision.

A method for fabricating a mask according to one or more embodiments includes an OPC method for generating a dummy layout based on the flare concept, generating a correction density map and a flare map using the dummy layout, and performing an OPC using the flare map and an OPC model. Thus, an excellent mask for preventing the occurrence of global errors due to exposing equipment may be fabricated.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the embodiments set forth in the claims.

What is claimed is:

1. An optical proximity correction (OPC) method, the method comprising:
   loading a target layout for a mask;
   generating a correction density map based on the target layout and a dummy layout for manipulation of flare to correct global errors caused by exposing equipment;
   generating a flare map via convolution integration of the correction density map and a point spread function (PSF) regarding the flare; and
   correcting the target layout using the flare map and an OPC model.

2. The method as claimed in claim 1, wherein generating the correction density map includes:
   defining the global errors based on a result of exposure evaluation for a wafer;
   calculating a flare correction amount for correcting the global errors based on a flare sensitivity (FS);
   generating Hall the dummy layout having a density distribution corresponding to the flare correction amount; and
   calculating the correction density map based on the target layout and the dummy layout.

3. The method as claimed in claim 2, wherein defining the global errors includes:
   measuring critical dimensions on the wafer,
   determining differences between CDs at respective locations of a full-shot, and
   trending the differences between the CDs at respective locations of the full-shot.

4. The method as claimed in claim 3, wherein:
   the FS corresponds to CD variation according to a flare change (%) (ΔCD/% flare), and,
   calculating the flare correction amount includes determining the largest CD error at the full-shot and calculating the flare correction amount corresponding to the largest CD error based on the FS.

5. The method as claimed in claim 2, wherein:
   generating the dummy layout including calculating the largest density for generating the flare correction amount and generating the dummy layout in which densities from a smallest density (%) to a largest density (%) are distributed.

6. The method as claimed in claim 2, wherein:
   generating the correction density map includes calculating the correction density map by adding the dummy layout to the target layout or subtracting the dummy layout from the target layout.

7. The method as claimed in claim 2, wherein calculating the correction density map includes applying the dummy layout to masks introduced to same exposing equipment.

8. The method as claimed in claim 1, wherein the global errors include a CD variation based on locations of slits that occur due to optical characteristics of exposing equipment and a systematic error of the exposing equipment.

9. The method as claimed in claim 1, wherein the correction density map or the flare map includes pixels smaller than or equal to 1 μm.

10. The method as claimed in claim 1, wherein the exposing equipment includes extreme ultraviolet (EUV) exposing equipment or deep ultraviolet (DUV) exposing equipment.

11. A method of fabricating a mask, the method comprising:
    performing an optical proximity correction (OPC) method for correcting global errors due to exposing equipment, the OPC method including generating a correction density map based on a target layout and a dummy layout for manipulation of flare;
    providing design data obtained via the OPC method as mask tape-out (MTO) design data;
    preparing mask data based on the MTO design data; and
    performing exposure on a substrate for a mask based on the mask data.

12. The method as claimed in claim 11, wherein performing the OPC method includes:
    loading the target layout regarding a mask;
    generating a flare map via convolution integration of the correction density map and a point spread function (PSF) regarding the flare; and
    correcting the target layout using the flare map and an OPC model.

13. The method as claimed in claim 12, wherein generating the correction density map includes:
    defining the global errors by measuring critical dimensions on a wafer, determining differences between CDs at respective locations of a full-shot, and obtaining a trend of the differences between the CDs at respective locations of the full-shot;
    determining the largest CD error at the full-shot and calculating a flare correction amount for correcting the global error using a flare sensitivity (FS) corresponding to CD variation according to a flare change (%) (ΔCD/% flare);
    calculating a largest density for generating the flare correction amount based on the flare correction amount and generating the dummy layout in which densities from a smallest density (%) to a largest density (%) are distributed; and
    calculating the correction density map based on the target layout and the dummy layout.

14. The method as claimed in claim 13, wherein:
    the global errors include a CD variation based on locations of slits caused by optical characteristics of exposing equipment and a systematic error of the exposing equipment, and
    the correction density map is generated by applying the dummy layout to masks introduced to same exposing equipment.

15. The method as claimed in claim 11, wherein:
    exposure is performed on the substrate for a mask using an E-beam, and
    the exposing equipment includes EUV exposing equipment or DUV exposing equipment.

16. An optical proximity correction (OPC) method, the method comprising:
    loading a target layout for a mask;
    generating a correction density map based on the target layout and a dummy layout for manipulation of flare to correct global errors;

generating a flare map based on the correction density map; and correcting the target layout based on the flare map and an OPC model.

17. The method as claimed in claim 16, wherein the global errors include ones caused by exposing equipment.

18. The method as claimed in claim 16, wherein generating the flare map includes performing convolution integration of the correction density map and a point spread function regarding the flare.

19. The method as claimed in claim 18, generating the correction density map includes:

defining the global errors based on a result of exposure evaluation for a wafer;

calculating a flare correction amount for correcting the global errors based on a flare sensitivity;

generating a dummy layout having a density distribution corresponding to the flare correction amount; and calculating the correction density map based on the target layout and the dummy layout.

20. The method as claimed in claim 19, wherein defining the global errors includes:

measuring critical dimensions on the wafer, determining differences between CDs at respective locations of a full-shot, and trending the differences between the CDs at respective locations of the full-shot.

* * * * *